(12) United States Patent
Peng et al.

(10) Patent No.: US 8,638,563 B2
(45) Date of Patent: Jan. 28, 2014

(54) ELECTRONIC DEVICE WITH PIVOTABLE ARM

(71) Applicant: Hong Fu Jin Precision Industry (ShenZhen) Co., Ltd., Shenzhen (CN)

(72) Inventors: Wen-Tang Peng, New Taipei (TW); Hai-Chen Zhou, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/748,834

(22) Filed: Jan. 24, 2013

(65) Prior Publication Data

US 2013/0135801 A1    May 30, 2013

Related U.S. Application Data

(62) Division of application No. 12/909,856, filed on Oct. 22, 2010, now Pat. No. 8,385,076.

(30) Foreign Application Priority Data

Jun. 28, 2010 (CN) .......................... 2010 1 0210824

(51) Int. Cl.
*H05K 1/14*    (2006.01)
(52) U.S. Cl.
USPC .................. 361/740; 361/679.31; 361/679.33; 361/679.58; 361/725; 312/223.1; 248/694; 439/377

(58) Field of Classification Search
USPC .......... 361/740, 679.31, 679.33, 679.58, 725; 312/223.1; 248/316, 694; 439/377
See application file for complete search history.

(56) References Cited

U.S. PATENT DOCUMENTS

| | | | |
|---|---|---|---|
| 5,340,340 A * | 8/1994 | Hastings et al. ................. | 439/64 |
| 5,751,551 A | 5/1998 | Hileman et al. | |
| 6,288,902 B1 * | 9/2001 | Kim et al. ..................... | 361/725 |
| 6,396,704 B1 | 5/2002 | White | |
| 6,442,021 B1 | 8/2002 | Bolognia et al. | |
| 2004/0012921 A1 * | 1/2004 | Hidaka et al. ................. | 361/685 |
| 2005/0007734 A1 * | 1/2005 | Peng et al. .................... | 361/685 |
| 2005/0014403 A1 | 1/2005 | Joist | |

(Continued)

FOREIGN PATENT DOCUMENTS

| | | |
|---|---|---|
| EP | 0780932 A1 | 6/1997 |
| JP | 10-228750 A | 8/1998 |

(Continued)

*Primary Examiner* — Xiaoliang Chen
(74) *Attorney, Agent, or Firm* — Altis Law Group, Inc.

(57) ABSTRACT

An exemplary electronic device includes a case, an inner body and a pivotable arm pivotally connected on the inner body by a pivot. The case defines an opening at a first lateral side thereof and a latching hole at a second lateral side thereof adjacent to the opening. The inner body is inserted in the case through the opening. The pivotable arm includes a frame engaged in the latching hole of the case, a latching member pivotally connected to the frame by the pivot, and a resilient member. The latching member includes an inner end and an outer end at opposite sides of the pivot. The outer end of the latching member is engaged in the latching hole. The resilient member abuts against the inner end of the latching member such that the inner end of the latching member biases the inner body.

7 Claims, 7 Drawing Sheets

(56) References Cited

U.S. PATENT DOCUMENTS

| | | | |
|---|---|---|---|
| 2005/0024819 A1* | 2/2005 | Peng et al. | 361/685 |
| 2005/0152106 A1* | 7/2005 | Coster et al. | 361/683 |
| 2007/0242426 A1* | 10/2007 | Coster et al. | 361/687 |
| 2009/0059507 A1* | 3/2009 | Peng et al. | 361/685 |
| 2009/0059509 A1* | 3/2009 | Peng et al. | 361/685 |
| 2010/0038919 A1 | 2/2010 | Wang | |
| 2010/0294905 A1* | 11/2010 | Peng et al. | 248/222.12 |
| 2010/0321879 A1* | 12/2010 | Peng et al. | 361/679.33 |
| 2011/0001031 A1* | 1/2011 | Peng et al. | 248/316.7 |
| 2011/0042985 A1* | 2/2011 | Peng et al. | 294/86.4 |
| 2011/0049319 A1* | 3/2011 | Peng et al. | 248/309.1 |
| 2011/0101831 A1* | 5/2011 | Wang et al. | 312/223.1 |
| 2012/0162893 A1* | 6/2012 | Lin et al. | 361/679.31 |

FOREIGN PATENT DOCUMENTS

| | | |
|---|---|---|
| JP | 11-149753 A | 6/1999 |
| JP | 2002-185155 A | 6/2002 |
| JP | 2004-54967 A | 2/2004 |
| JP | 2005-45244 A | 2/2005 |
| JP | 2008-226902 A | 9/2008 |
| JP | 2010-186865 A | 8/2010 |

* cited by examiner

ELECTRONIC DEVICE WITH PIVOTABLE ARM

BACKGROUND

1. Technical Field

The disclosure generally relates to electronic devices, and more particularly, to an electronic device having a pivotable arm for fixing a detachable electronic component of the electronic device in a case thereof.

2. Description of Related Art

Generally, data storage and like devices, such as hard disk drives, compact disk read-only memory (CD-ROM) drives, digital video disc (DVD) drives and floppy disk drives, among others, are detachably inserted in a case of an electronic device. The mounting arrangement facilitates easy replacing of such devices. However, such arrangement may result in poor mechanical and electrical contact of the storage device due to tolerances of the case and the storage device.

What is needed, therefore, is a means which can overcome the limitations described.

DETAILED DESCRIPTION

Figure 1:
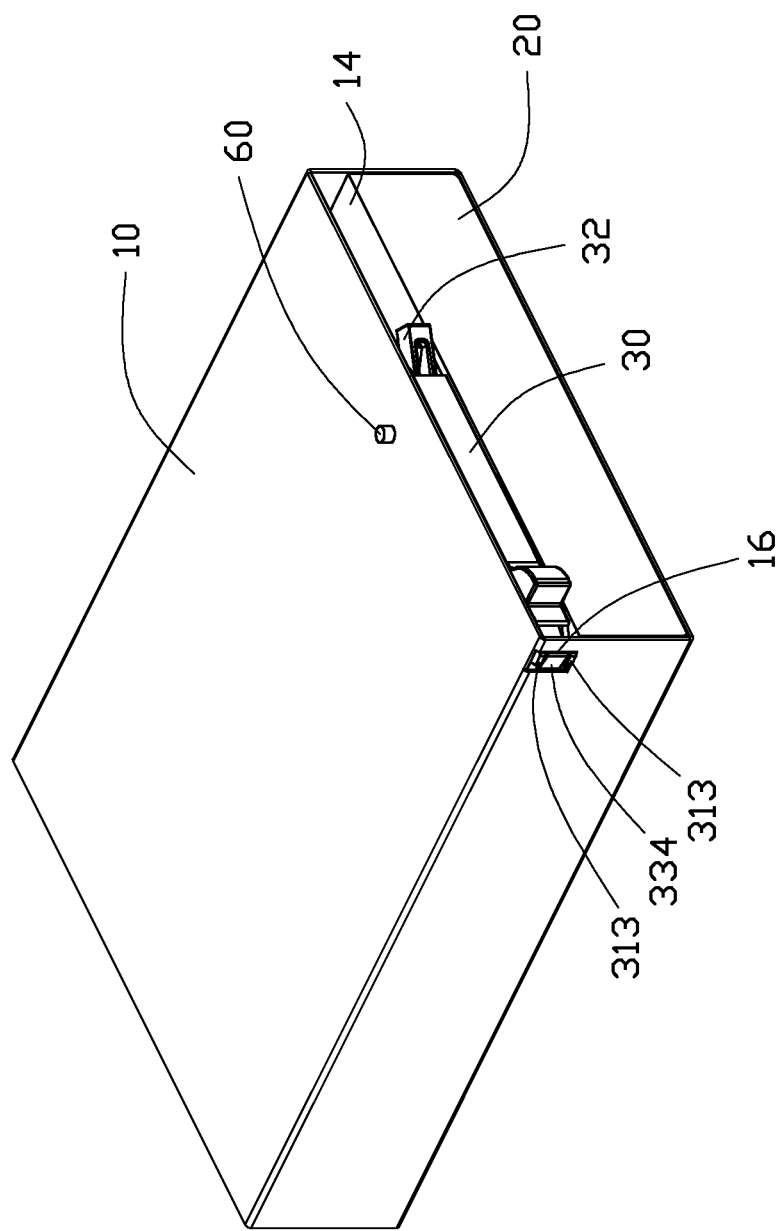
FIG. 1 is an isometric, assembled view of an electronic device in accordance with an exemplary embodiment of the disclosure.

Referring to FIG. 1, an electronic device according to an exemplary embodiment of the disclosure is shown. The electronic device includes a case 10, an inner body 20 inserted in the case 10, and a pivotable arm 30 fixing the inner body 20 in the case 10. The inner body 20 can be any piece of electronic component which needs to be installed in the case 10, such as a hard disk drive, a CD-ROM drive, a DVD drive, a floppy disk drive, etc.

Figure 2:
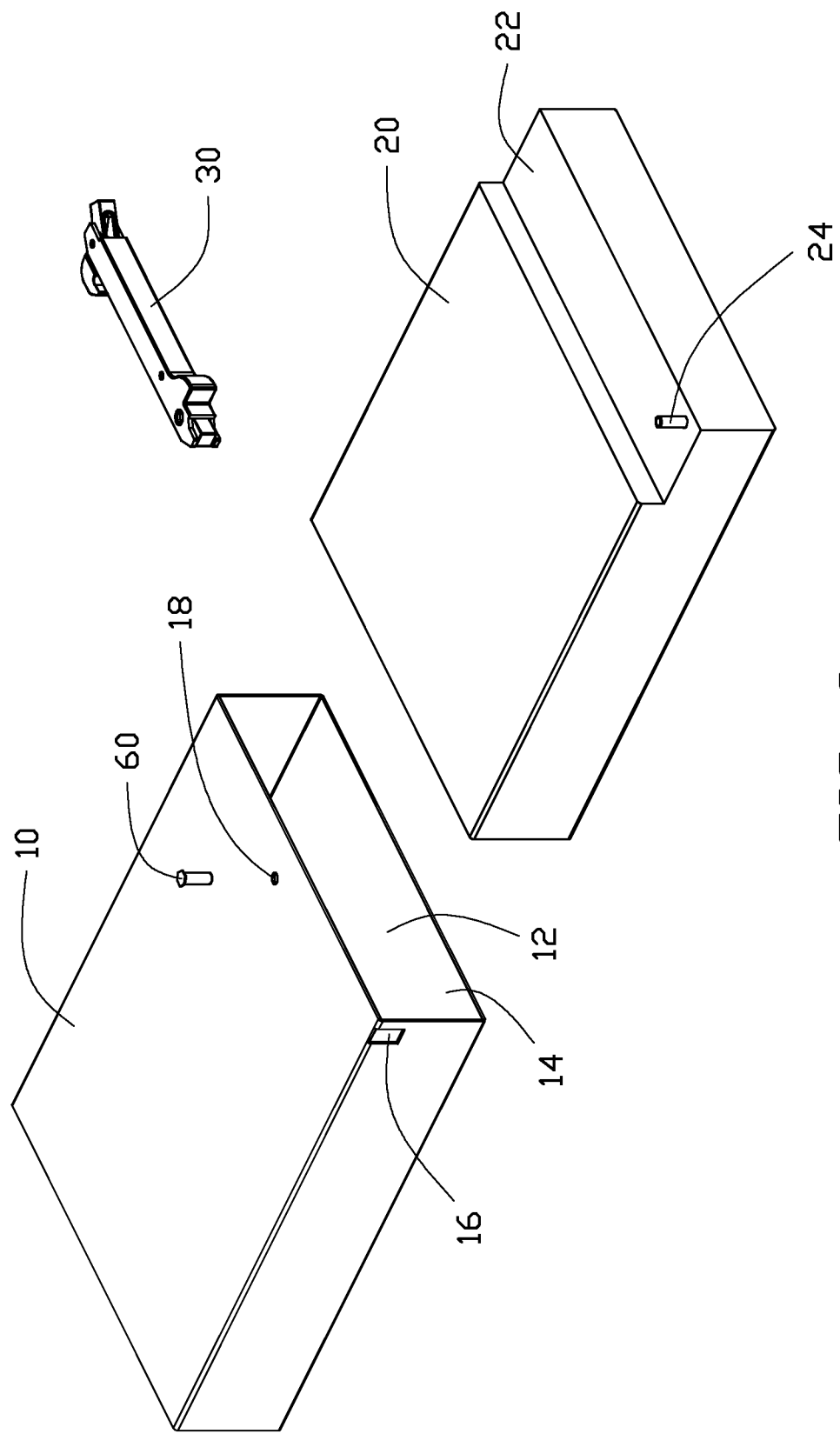
FIG. 2 is an exploded view of the electronic device of FIG. 1.

Referring also to FIG. 2, a chamber 12 is defined in the case 10 for receiving the inner body 20 therein. An opening 14 is defined in a front side of the case 10, for installing the inner body 20 into the chamber 12 of the case 10. A latching hole 16 is defined in a left side of the case 10, and communicates with the chamber 12. In this embodiment, the latching hole 16 is rectangular; and is located at a corner of the left side of the case 10, adjacent to the front side and a top side of the case 10. A through hole 18 is defined in the top side of the case 10, and communicates with the chamber 12. In this embodiment, the through hole 18 is circular; and is located at a middle of a front edge portion of the top side of the case 10, generally adjacent to the opening 14.

Figure 7:
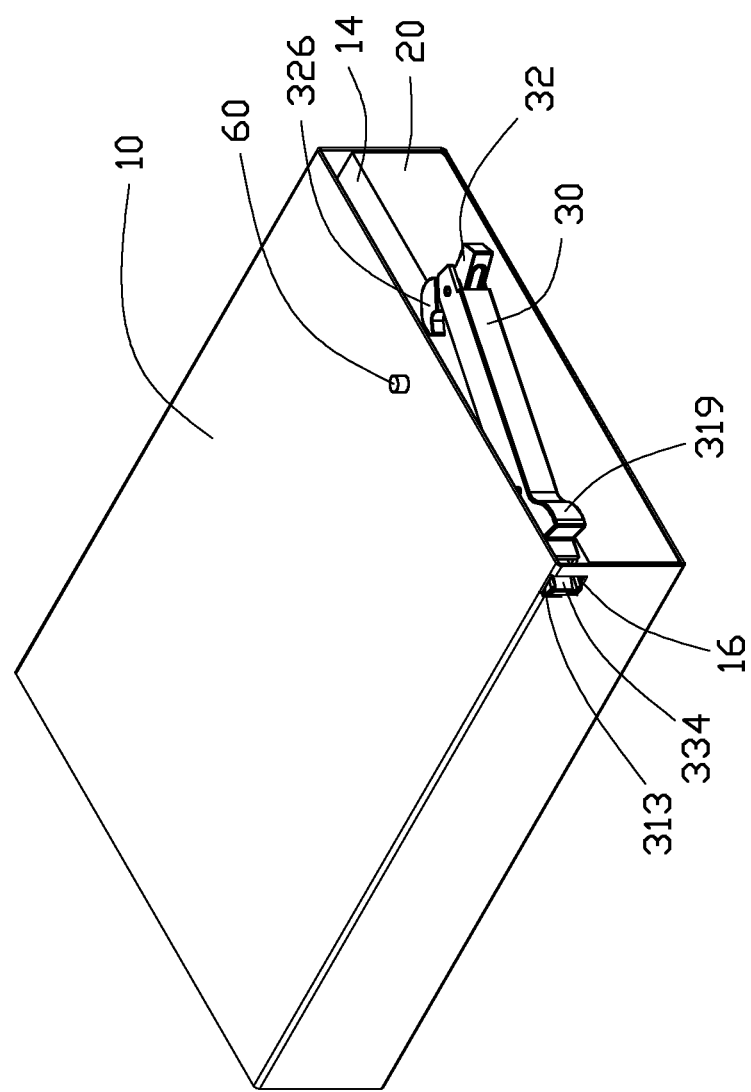

A locking post 60 extends through the through hole 18 into the chamber 12 of the case 10. When the electronic device is assembled, an enlarged top end (head) of the locking post 60 abuts the top side of the case 10 at a periphery of the through hole 18, thereby fixing the locking post 60 on the case 10, as shown in FIGS. 1 and 7. A portion of the locking post 60 extended into the chamber 12 is shorter than a depth of the chamber 12 of the case 10. That is, a bottom end of the locking post 60 is higher than a bottom side of the case 10. In the illustrated embodiment, the bottom end of the locking post 60 is closer to the top side of the case 10 than the bottom side of the case 10.

The inner body 20 forms a step 22 at a front edge thereof. Preferably, a thickness of other portions of the inner body 20 is substantially equal to the depth of the chamber 12, with a height difference between the step 22 and the other portions of the inner body 20 being not less than the length of the locking post 60 extended into the case 10. A pivot 24 extends up from a corner of the step 22 for supporting the pivotable arm 30. In this embodiment, the pivot 24 is located adjacent to both a left edge and a front edge of the step 22. A height of the pivot 24 does not exceed the height difference between the step 22 and the other portions of the inner body 20. Preferably, and in this embodiment, a top end of the pivot 24 is generally coplanar with a top side of the other portions of the inner body 20.

Figure 3:
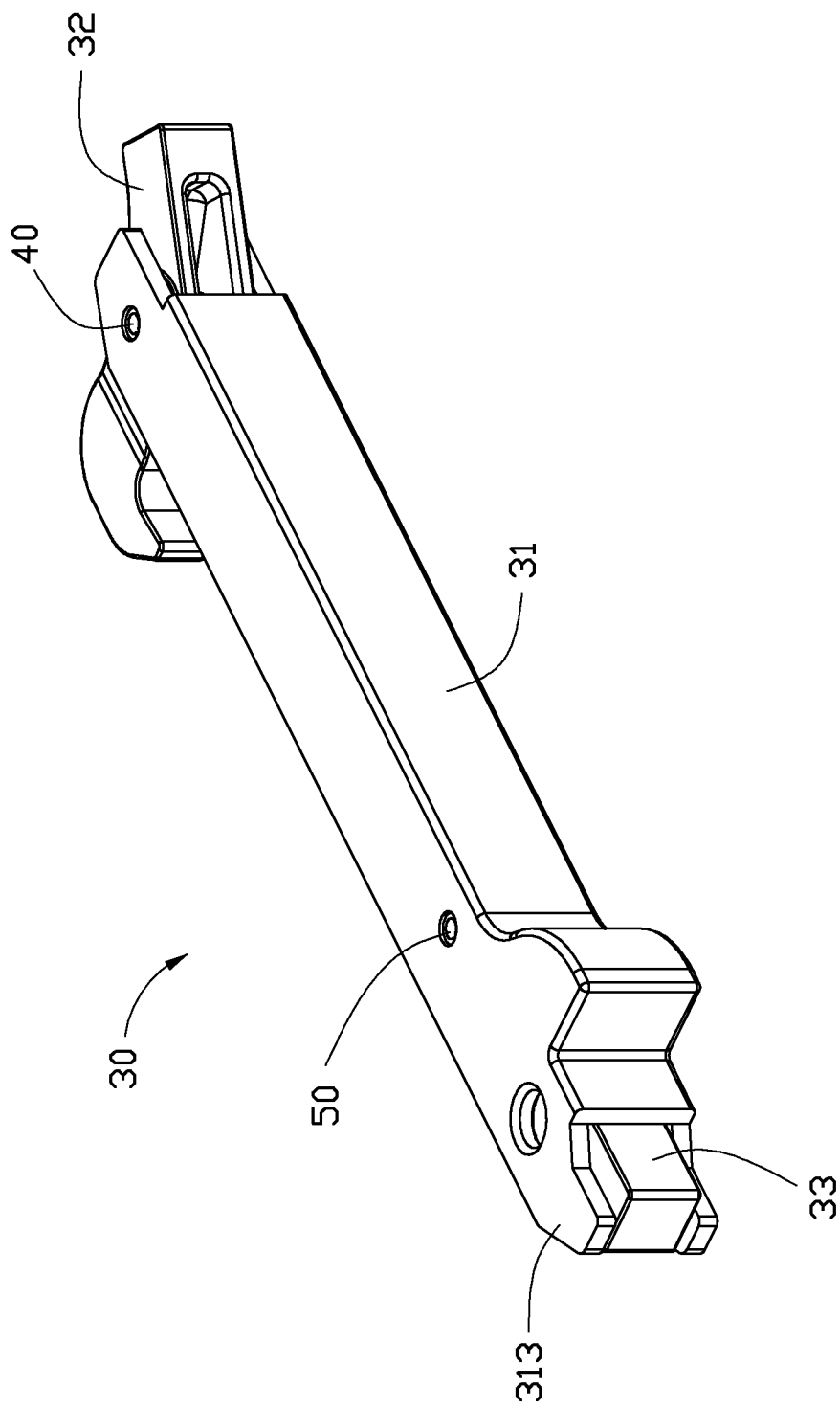
FIG. 3 is an enlarged view of a pivotable arm of the electronic device of FIG. 2.
Figure 4:
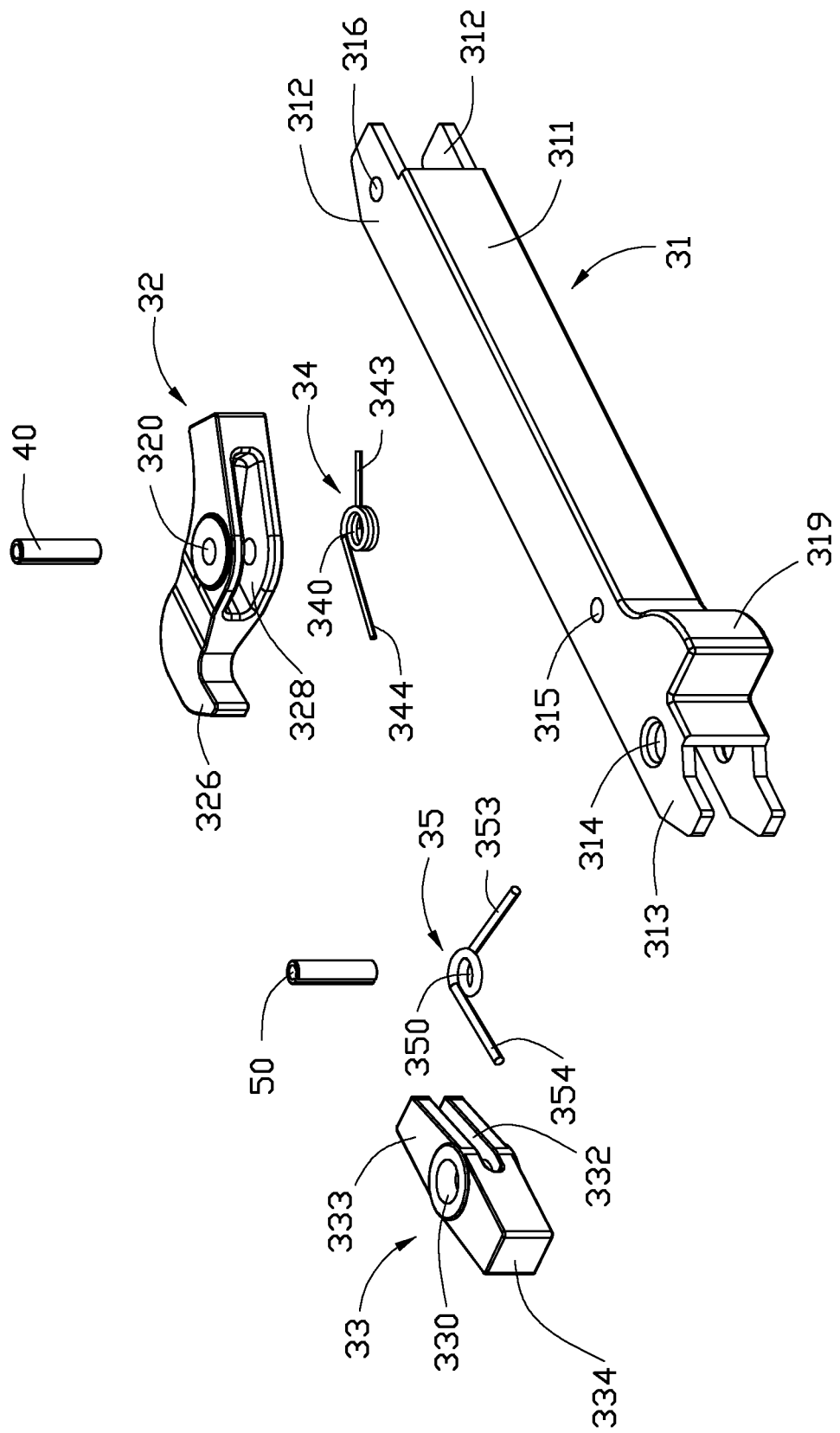
FIG. 4 is an exploded view of the pivotable arm of FIG. 3.
Figure 5:
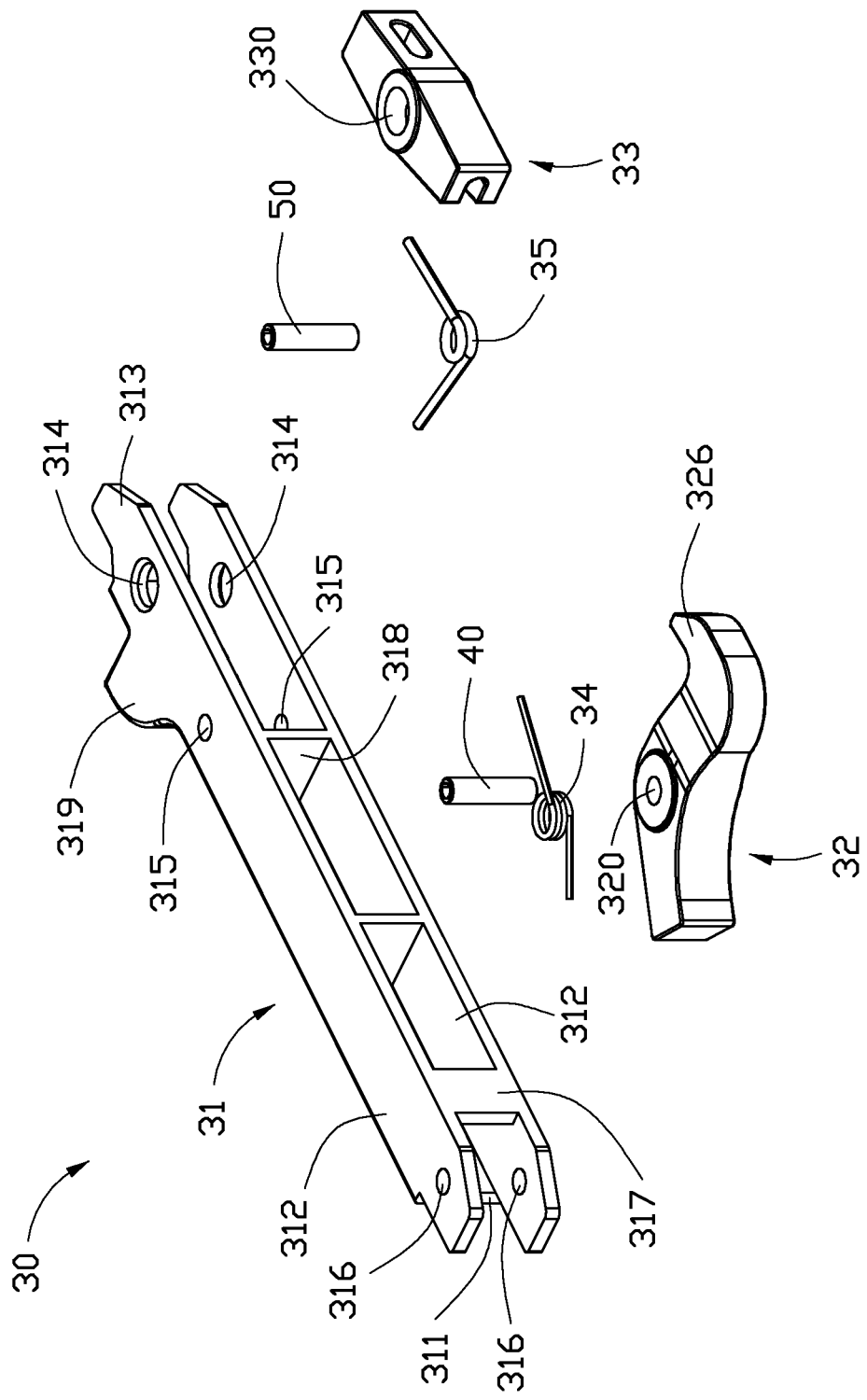
FIG. 5 is similar to FIG. 4, but shows the pivotable arm viewed from another aspect.

Referring to FIGS. 3-5, the pivotable arm 30 includes a frame 31, a locking member 32, a latching member 33, an elastic member 34, a resilient member 35, a pivot pin 40, and a holding pin 50.

The frame 31 includes a vertical plate 311 and two horizontal plates 312 respectively extending from top and bottom edges of the vertical plate 311 towards the case 10. The horizontal plates 312 are parallel to and spaced from each other. The horizontal plates 312 are longer than the vertical plate 311, with opposite ends (i.e., left and right ends) of the horizontal plates 312 protruding beyond ends of the vertical plate 311. The left end of each horizontal plate 312 forms a latching tab 313.

A holding pin hole 315 is defined in each of the horizontal plates 312, adjacent to the latching tab 313. The holding pin holes 315 are for receiving the holding pin 50. A pivot pin hole 316 is defined in the right end of each of the horizontal plates 312. The pivot pin holes 316 are for receiving the pivot pin 40. A pivot hole 314 is defined in the left end of each of the horizontal plates 312, between the holding pin hole 315 and the latching tab 313.

A positioning protrusion 319 protrudes out from a left end of the vertical plate 311. The positioning protrusion 319 is located generally between the holding pin hole 315 and the pivot hole 314. A first rib 317 and a second rib 318 are formed between the two horizontal plates 312, for enhancing a strength (intensity) of the frame 31. The first rib 317 is located adjacent to the pivot pin hole 316, and the second rib 318 is located adjacent to the holding pin hole 315. The first rib 317 is parallel to and spaced from the vertical plate 311, while the second rib 318 perpendicularly intersects the vertical plate 311 and the horizontal plates 312.

The locking member 32 defines a central hole 320 at a central portion thereof. The central hole 320 extends through the locking member 32. A diameter of the central hole 320 is substantially equal to that of the pivot pin holes 316 of the horizontal plates 312. A slot 328 is defined in a lateral side of the locking member 32, for receiving the elastic member 34. The slot 328 communicates with the central hole 320. A hook 326 is formed at an end of the locking member 32, for clasping the portion of the locking post 60 extended into the chamber 12 of the case 10.

The latching member 33 defines a central hole 330 in a central portion thereof. The central hole 330 extends through the latching member 33. A diameter of the central hole 330 is substantially equal to that of the pivot holes 314 of the horizontal plates 312. A groove 332 is defined in the latching member 33, communicating with the central hole 330. The groove 332 extends through an inner end 333 of the latching member 33.

During assembly of the pivotable arm 30, the latching member 33 is disposed at a left end of the frame 31, and sandwiched between the two horizontal plates 312. The inner end 333 of the latching member 33 is oriented (points) towards a right end of the frame 31. The central hole 330 of the latching member 33 is aligned with the pivot holes 314 of the horizontal plates 312. An outer end 334 of the latching member 33 is aligned with the latching tabs 313 of the horizontal plates 312.

In this embodiment, the elastic member 34 and the resilient member 35 each are blade springs. The elastic member 34 includes a hollow main body 340, and two legs 343, 344 extending along different directions from bottom and top ends of the main body 340, respectively. The resilient member 35 includes a hollow main body 350, and two legs 353, 354 extending along different directions from bottom and top ends of the main body 350, respectively.

The resilient member 35 is disposed between the two horizontal plates 312, with the main body 350 aligned with the holding pin holes 315. The leg 354 of the resilient member 35 extends into the groove 332 of the latching member 33 and abuts against the latching member 33 at a periphery of the groove 332, and the leg 353 of the resilient member 35 abuts against the second rib 318. The holding pin 50 extends through the holding pin holes 315 and the main body 350 of the resilient member 35, to assemble the resilient member 35 on the frame 31. In such a state, the inner end 333 of the latching member 33 is pushed slightly away from the vertical plate 311 by the leg 353 of the resilient member 35, and accordingly, the outer end 334 of the latching member 33 is pushed towards the vertical plate 311 slightly.

The elastic member 34 is received in the slot 328 of the locking member 32, with the main body 340 of the elastic member 34 aligned with the central hole 320 of the locking member 32. The leg 343 of the elastic member 34 is entirely received in the slot 328 and abuts against an end of the locking member 32 opposite from the hook 326, and the leg 344 of the elastic member 34 adjacent to the hook 326 protrudes out from the locking member 32.

The locking member 32 with the elastic member 34 received therein is disposed at a right end of the frame 31, and located between the two horizontal plates 312. The lateral side of the locking member 32 with the slot 328 faces the vertical plate 311, and the central hole 320 of the locking member 32 is aligned with the pivot pin holes 316. The pivot pin 40 extends through the pivot pin holes 316 of the horizontal plates 312, the central hole 320 of the locking member 32 and the main body 350 of the elastic member 35 to rotatably assemble the locking member 32 on the frame 31. In such a state, the leg 344 of the elastic member 34 abuts against an inner surface of the first rib 317.

The pivotable arm 30 is then rotatably assembled onto the inner body 20, by extension of the pivot 24 through the pivot holes 314 of the horizontal plates 312 and the central hole 330 of the latching member 33.

Figure 6:
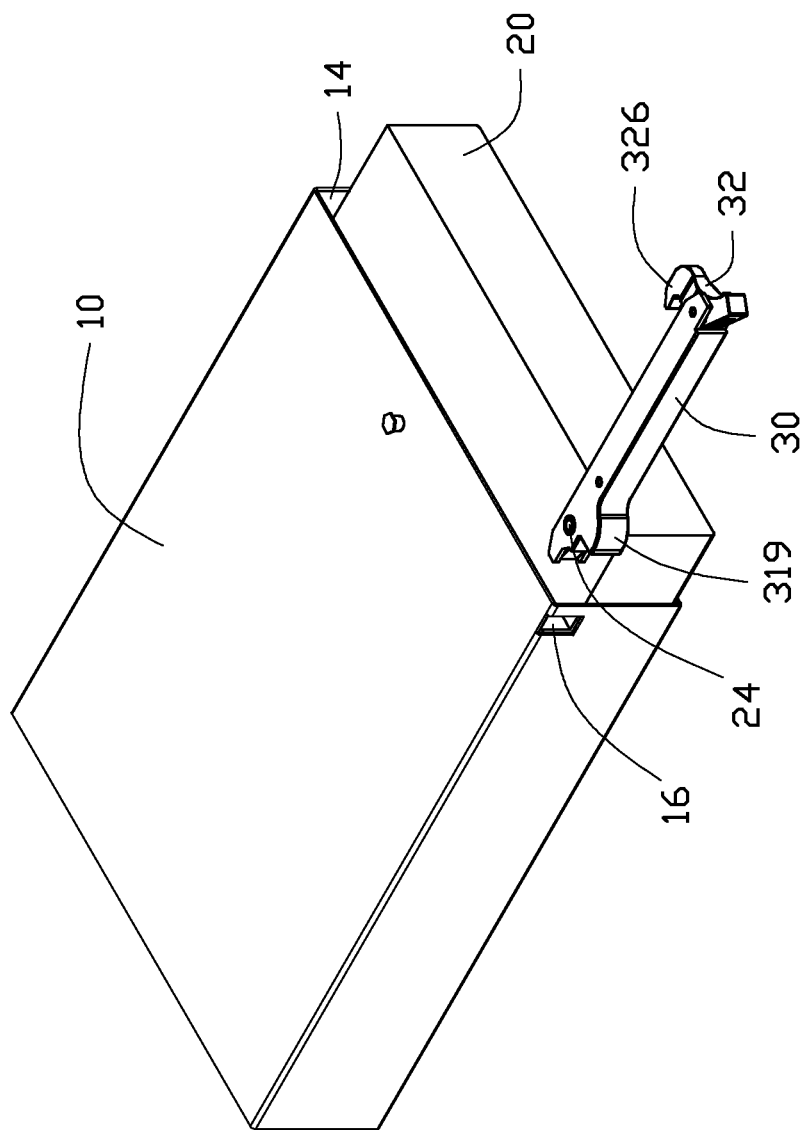
FIGS. 6-7 are similar to FIGS. 1-2, but show successive stages in assembly of the electronic device.

Referring to FIGS. 6 and 7, during installation of the inner body 20 into the chamber 12 of the case 10, the pivotable arm 30 is pivoted out to be substantially perpendicular to the inner body 20. The positioning protrusion 319 is located beyond the left edge of the inner body 20. The inner body 20 then slides into the case 10 until the positioning protrusion 319 abuts a front edge of the left side of the case 10. The pivotable arm 30 is then pivoted back towards the step 22 of the inner body 20. Thereby, the latching tabs 313 of the pivotable arm 30 engage into the latching hole 16 of the left side of the case 10, and the inner body 20 is held in the case 10.

After the inner body 20 has entered the case 10, the locking post 60 is inserted into the through hole 18, with the bottom end of the locking post 60 located on the step 22 of the inner body 20. A user applies force to pivot the locking member 32 such that the hook 326 of the locking member 32 departs from the frame 31, increasing the angle therebetween. In such a state, the frame 31 is pivoted into the case 10 completely, and thus the bottom end of the locking post 60 is sandwiched between the hook 326 of the locking member 32 and the frame 31. Then the force applied on the locking member 32 is removed, and the hook 326 clasps the locking post 60 tightly by reason of the elastic force of the elastic member 34. Thus, the inner body 20 is fixed in the case 10 by the pivotable arm 30.

In addition, the outer end 334 of the latching member 33 between the latching tabs 313 is also received in the latching hole 16 of the case 10, and is pushed to be parallel to the vertical plate 311. The resilient member 35 thus exerts an elastic force on the inner end 333 of the latching member 33, whereby the inner end 333 of the latching member 33 in turn applies a force on an inner vertical edge of the inner body 20 which is adjacent to and substantially faces the step 22. This helps maintain the inner body 20 firmly in position, so that good connection between the inner body 20 and the case 10 is obtained. Furthermore, movement (shifting) of the inner body 20 in the case 10 is minimized or prevented altogether, and degradation of or damage to the inner body 20 that would otherwise be caused by the case 10 is avoided.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device, comprising:

a case defining a through hole at a top side thereof, an opening at a first lateral side thereof adjacent to the through hole, and a latching hole at a second lateral side thereof, the first lateral side being adjacent to the second lateral side;

an inner body received in the case through the opening and having a pivot extending up therefrom;

a locking post extending into the case via the through hole; and a pivotable arm pivotally connected on the inner body by the pivot, the pivotable arm comprising a frame, a latching member pivotally connected to one end of the frame by the pivot, a locking member pivotally connected to the other end of the frame, and a resilient member;

the frame comprising:

two latching tabs at the one end thereof; and a vertical plate and two horizontal plates respectively extending from top and bottom edges of the vertical plate, the two latching tabs formed at same ends of the two horizontal plates, a pivot hole and a holding pin hole defined in each of the horizontal plates, the pivot hole located between the latching tab and the holding pin hole, the pivot holes receiving the pivot therein;

the latching member received in the latching hole of the case, the latching member comprising an inner end and an outer end at opposite sides of the pivot, the inner end having a groove defined therein, the outer end received in the latching hole;

the resilient member comprising a main body and two legs, a holding pin extending through the main body of the resilient member and the holding pin holes of the frame to assemble the resilient member to the frame, one leg of the resilient member received in the groove of the inner end of the latching member and abutting against the inner end of the latching member such that the inner end of the latching member biases the inner body, and the other leg of the resilient member abutting against the frame; and the locking member comprising a hook clasping the locking post;

wherein the resilient member, the latching member and the locking member are located between the vertical plate and the two horizontal plates.

2. The electronic device of claim 1, further comprising an elastic member comprising a main body and two legs, wherein the main body of the elastic member is received in the locking member, one leg of the elastic member abuts against the locking member, and the other leg of the elastic member abuts against the frame.

3. The electronic device of claim 2, further comprising a pivot pin extending through the locking member and the main body of the elastic member to assemble the locking member on the other end of the frame.

4. The electronic device of claim 1, wherein the frame further comprises a first rib and a second rib formed respectively interconnecting the two horizontal plates, the first rib is adjacent to the pivot pin holes and parallel to the vertical plate, and the second rib is adjacent to the holding pin holes and perpendicularly intersects the vertical plate.

5. The electronic device of claim 1, wherein a positioning protrusion protrudes out from the vertical plate, between the pivot holes and the holding pin holes.

6. The electronic device of claim 1, wherein the inner body comprises a step on which the pivotable arm is located when the inner body is fixed in the case.

7. The electronic device of claim 6, wherein the pivot extends up from the step of the inner body.

* * * * *